US012687790B2

(12) United States Patent
Scholten et al.

(10) Patent No.: US 12,687,790 B2
(45) Date of Patent: Jul. 21, 2026

(54) TOOL FOR MODIFYING A SUPPORT SURFACE

(71) Applicant: ASML NETHERLANDS B.V., Veldhoven (NL)

(72) Inventors: Bert Dirk Scholten, Best (NL); Peter Andreas Maria Billekens, Meterik (NL); Tiannan Guan, Best (NL); Tjarco Lindeijer, Eindhoven (NL); Harold Anton Mehagnoul, Eindhoven (NL); Jimmy Matheus Wilhelmus Van De Winkel, Kessel (NL); Cas Johannes Petrus Maria Van Nuenen, Eindhoven (NL); Hendrikus Theodorus Jacobus Franciscus Van Verseveld, Eindhoven (NL); Marcus Martinus Petrus Adrianus Vermeulen, Leende (NL)

(73) Assignee: ASML NETHERLANDS B.V., Veldhoven (NL)

( * ) Notice: Subject to any disclaimer, the term of this patent is extended or adjusted under 35 U.S.C. 154(b) by 122 days.

(21) Appl. No.: 17/260,649

(22) PCT Filed: Jun. 27, 2019

(86) PCT No.: PCT/EP2019/067224
§ 371 (c)(1),
(2) Date: Jan. 15, 2021

(87) PCT Pub. No.: WO2020/020568
PCT Pub. Date: Jan. 30, 2020

(65) Prior Publication Data
US 2021/0263418 A1    Aug. 26, 2021

(30) Foreign Application Priority Data
Jul. 27, 2018    (EP) ..................................... 18185938

(51) Int. Cl.
| | |
|---|---|
| *G03F 7/00* | (2006.01) |
| *B24B 37/14* | (2012.01) |
| *B24B 37/16* | (2012.01) |

(52) U.S. Cl.
CPC .............. *G03F 7/707* (2013.01); *B24B 37/14* (2013.01); *B24B 37/16* (2013.01); *G03F 7/7085* (2013.01); *G03F 7/70925* (2013.01)

(58) Field of Classification Search
CPC .... G03F 7/707; G03F 7/7085; G03F 7/70925; G03F 7/70691–70791; G03F 7/708; (Continued)

(56) References Cited

U.S. PATENT DOCUMENTS

| | | |
|---|---|---|
| 5,191,200 A | 3/1993 | van der Werf et al. |
| 5,607,341 A * | 3/1997 | Leach ..................... B24B 37/11 451/285 |

(Continued)

FOREIGN PATENT DOCUMENTS

JP    2014128877    7/2014

OTHER PUBLICATIONS

International Search Report and Written Opinion issue in corresponding PCT Patent Application No. PCT/EP2019/067224, dated Oct. 11, 2019.

*Primary Examiner* — Christina A Riddle
(74) *Attorney, Agent, or Firm* — Pillsbury Winthrop Shaw Pittman, LLP

(57) ABSTRACT

A tool for modifying substrate support elements of a substrate holder, the substrate support elements having support surfaces for supporting a substrate, the tool includes a main body having a main body surface, and multiple protrusions from the main body surface, the multiple protrusions having distal ends configured to contact the support surfaces to modify the substrate support elements. Furthermore, a litho- (Continued)

graphic apparatus and a method comprising such a tool are provided.

20 Claims, 5 Drawing Sheets

(58) Field of Classification Search
CPC ............. G03F 7/70808; G03F 7/70825; G03F 7/70833; G03F 7/70841; G03F 7/70908; G03F 7/7095; G03F 7/70975; G03F 7/70991; G03F 7/70616; G03F 7/70641; G03F 7/7065; G03F 9/7003; G03F 9/7023–7034; B24B 37/14; B24B 37/16; H01L 21/6875; H10P 72/7614
USPC ....... 355/30, 72–77; 250/492.1–492.3, 504 R
See application file for complete search history.

(56) References Cited

U.S. PATENT DOCUMENTS

| | | | |
|---|---|---|---|
| 6,392,738 B1 | 5/2002 | van de Pasch et al. | |
| 7,078,715 B2 | 7/2006 | Vink et al. | |
| 8,810,777 B2 | 8/2014 | Cadee et al. | |
| 2001/0008830 A1 | 7/2001 | Tolles et al. | |
| 2002/0058426 A1* | 5/2002 | Mandigo | B24B 37/0056 |
| | | | 438/792 |
| 2005/0061995 A1 | 3/2005 | Vink et al. | |
| 2006/0079162 A1* | 4/2006 | Yamashita | B24B 53/017 |
| | | | 451/444 |
| 2010/0214549 A1* | 8/2010 | Cadee | B24B 31/112 |
| | | | 355/72 |
| 2010/0279586 A1* | 11/2010 | Schwappach | B24D 11/00 |
| | | | 451/340 |
| 2014/0128877 A1 | 5/2014 | O'Halloran et al. | |
| 2014/0154961 A1* | 6/2014 | Fiore | B24D 7/06 |
| | | | 451/527 |
| 2015/0087212 A1* | 3/2015 | Doering | B24B 53/017 |
| | | | 451/443 |
| 2016/0016280 A1* | 1/2016 | Chen | B24B 37/10 |
| | | | 438/692 |
| 2016/0276203 A1* | 9/2016 | Gratrix | H01L 21/6875 |
| 2017/0095903 A1* | 4/2017 | Galpin | B24D 5/06 |
| 2017/0274496 A1* | 9/2017 | Cook | B24B 37/26 |
| 2018/0154496 A1 | 6/2018 | Gratrix | |
| 2018/0182657 A1 | 6/2018 | Gratrix | |
| 2018/0326553 A1* | 11/2018 | Chou | B24D 7/00 |
| 2018/0366331 A1* | 12/2018 | Nguyen | B24B 37/26 |
| 2019/0030678 A1* | 1/2019 | Kumar | B24B 37/245 |

* cited by examiner

Fig. 1

Fig. 3
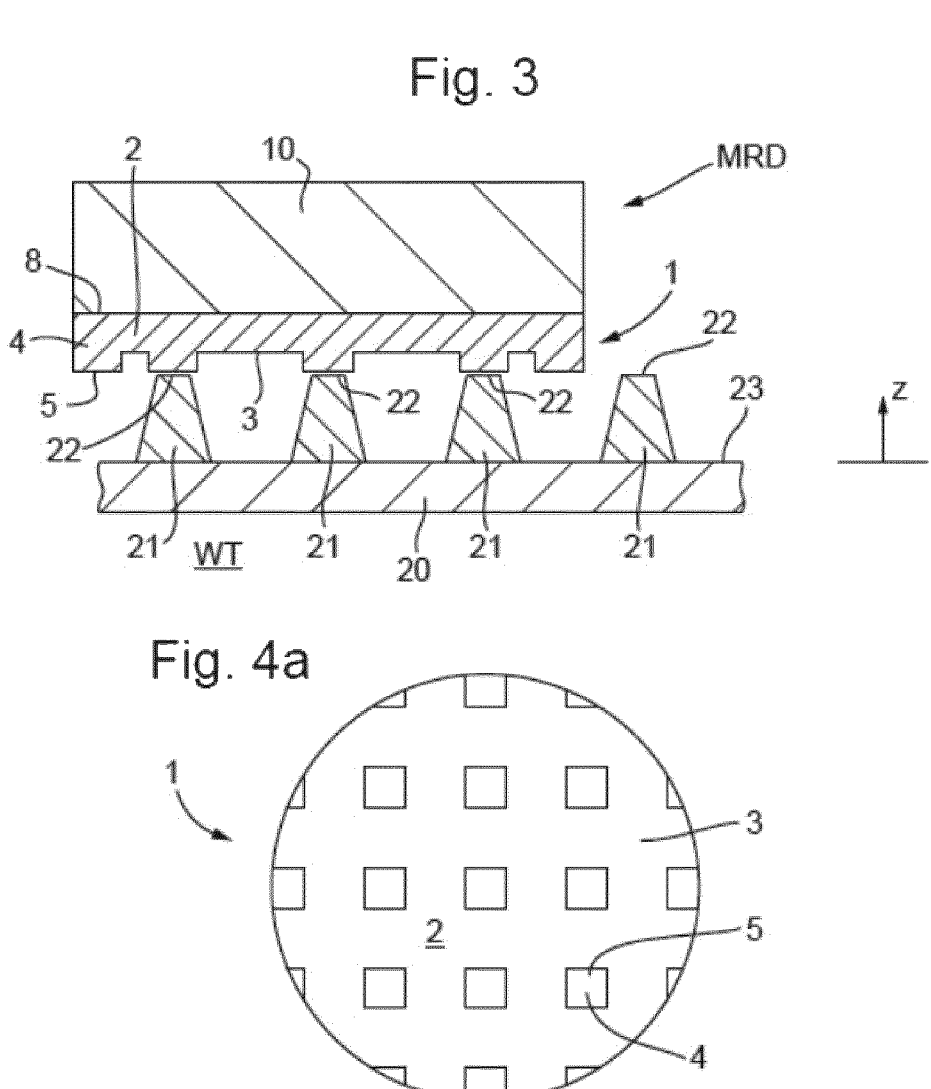
Fig. 4a
Fig. 4b
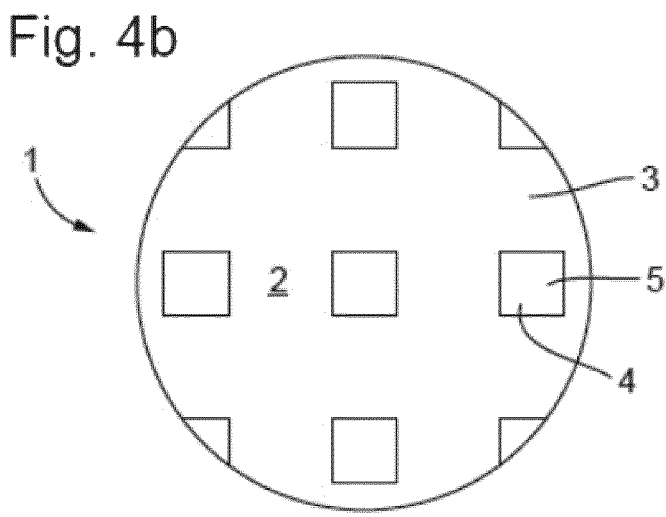

TOOL FOR MODIFYING A SUPPORT SURFACE

CROSS-REFERENCE TO RELATED APPLICATIONS

This application is the U.S. national phase entry of PCT Patent Application No. PCT/EP2019/067224, filed on Jun. 27, 2019, which claims the benefit of priority of European Patent Application No. 18185938.0, which was filed on Jul. 27, 2018 and which is incorporated herein in its entirety by reference.

FIELD

The present invention relates to tools for modifying a holder, methods for modifying a holder using the tool, and lithographic apparatus comprising the tool.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

There is a continuing desire to manufacture devices, e.g. integrated circuits, with ever smaller features. Integrated circuits and other microscale devices are often manufactured using optical lithography, but other manufacturing techniques, such as imprint lithography, e-beam lithography and nano-scale self assembly are known.

During manufacturing, the device is irradiated. It is important to ensure that the irradiation process is as accurate as possible. One of the issues with making the irradiation processes as accurate as possible is ensuring that the device to be irradiated is in the correct position. In order to control the position of the device, a substrate holder can be used. Generally, a substrate will be supported by the substrate holder whilst the substrate is being irradiated. When the substrate is positioned on the substrate holder, friction between the substrate and the substrate holder may prevent the substrate from flattening out over a surface of the substrate holder. To address this issue, the substrate holder can be provided with support elements which minimize the contact area between the substrate and the substrate holder. The support elements on the surface of the substrate holder may otherwise be referred to as burls or protrusions. The support elements are generally regularly spaced (e.g. in a uniform array) and of uniform height and define a very flat overall support surface on which the substrate can be positioned. The support elements reduce the contact area between the substrate holder and the substrate, thus reducing friction, and allowing the substrate to move to a flatter position on the substrate holder.

The support elements generally extend substantially perpendicularly from a surface of the substrate holder. In operation, the backside of the substrate is supported on the support elements, at a small distance from the main body surface of the substrate holder, in a position substantially perpendicular to the direction of propagation of the projection beam. Thus, the tops of the support elements (i.e. support surfaces), rather than the main body surface 3 of the substrate holder, define an effective support surface for the substrate.

In order to avoid overlay errors during projection of a patterned beam of radiation on a substrate, it is desirable that the substrate top surface be flat. Unevenness of the supporting surfaces of the substrate support may lead to an uneven top surface of the substrate. Therefore, it is desirable to avoid unevenness in the substrate support.

Unevenness of the supporting surfaces can be caused by dissimilarity between the heights of material that makes up the support elements themselves. This is typically the case when a new substrate holder has been manufactured. Wear may also lead to unevenness. In a known embodiment, a substrate support contains a substrate table WT (otherwise referred to as a chuck) on which the substrate holder with the support elements is supported. In an alternative embodiment the substrate table WT and substrate holder may be integrated in a single unit. Unevenness may be the result of differences between the heights of the support elements, or in the backside of the substrate holder or in the substrate table WT. Therefore these elements are carefully made level. Nevertheless it has been found that unevenness may also result when the substrate table WT and the substrate holder (and any other elements) are assembled or installed. Similar problems may be encountered with support tables or holders for other articles that have to be supported in a well-defined plane across the beam path, such as reflective patterning devices or transmission patterning devices.

US 2005/0061995 A1, the contents of which is herein incorporated by reference in its entirety, provides a lithographic projection apparatus including a detector to detect height deviations of the support elements that affect a surface flatness of the article, a height adjustment device arranged to independently modify a height of the support element material of individual support elements when the support table is operable in the apparatus, and a controller coupled between the detector and the height adjustment device and arranged to control the height adjustment device to adjust the height of the support elements corresponding to the detected height deviations of the support elements that affect the surface flatness of the article.

An in situ height adjustment device is used to alter the height of the material that at least the top of individual support elements are integrally made of, when the support table is at an operable position in the lithographic projection apparatus. By "operable," it is meant that the support holder may be moved to a pattern projection position in the apparatus from the operable position without movements that are more disruptive to the support table assembly than during normal use. "Integrally made" refers to material that is used to manufacture the support holder or coatings or other material layers on the support elements, but not to accidental foreign material such as pollution. By adjusting the height of the support elements in the assembled support holder in the lithographic apparatus, at such an operable position, a reliable local and global height adjustment may be realized.

A detector determines which of the support elements have a height deviation and a control unit controls the height adjustment device, for example, to remove a part of the material of selected support elements with excess height, but not from other support elements that do not have an excess height, or an excess height below a threshold.

Known tools and methods may still be improved to provide support elements with improved flatness. Additional or alternative methods and tools may be desirable to achieve a preferred flatness in a different way. Furthermore, it is beneficial to achieve this flatness whilst also providing a desired level of roughness on the support elements to provide some friction between the support elements and the substrate.

SUMMARY

It is desirable for cost of ownership, cost of goods and/or quality of overlay to provide an improved height adjustment tool for use in a lithographic apparatus, or at least an alternative therefor. Furthermore, it is desirable to provide a method for use of such improved or alternative height adjustment tool and a lithographic apparatus comprising such an improved or alternative height adjustment tool.

According to the invention, there is provided a tool for modifying substrate support elements of a substrate holder, the substrate support elements having support surfaces for supporting a substrate, said tool comprising a main body having a main body surface, wherein the tool comprises multiple protrusions from the main body surface, the multiple protrusions having distal ends configured to contact the support surfaces to modify the substrate support elements.

According to an embodiment of the invention, there is provided a method for modifying substrate support elements of a substrate holder, the substrate support elements having support surfaces for supporting a substrate, said method comprising: providing the tool as described herein; contacting at least some of the support surfaces with the distal ends of the protrusions of the tool and using the tool to modify the support surfaces.

According to an embodiment of the invention, there is provided a lithographic apparatus comprising: a substrate holder having a plurality of support elements that are configured to support a substrate; a material removing device configured to modify the substrate support elements of the substrate holder, the material removing device having a tool for modifying the substrate support elements of the substrate holder as described herein.

According to an embodiment of the invention, there is provided a method for modifying substrate support elements of a substrate holder, the substrate support elements having support surfaces for supporting a substrate, said method comprising: providing the lithographic apparatus described herein; contacting at least some of the support surfaces with the distal ends of the protrusions of the tool and using the tool to modify the support surfaces.

According to the invention, there is provided a lithographic apparatus comprising: an article holder having a plurality of support elements, the support elements having support surfaces configured to support an article; a material removing device configured to modify support elements of the article holder, the material removing device having a tool comprising a main body having a main body surface, wherein the tool comprises multiple protrusions from the main body surface, the multiple protrusions having distal ends configured to contact the support surfaces to modify the support elements.

According to an embodiment of the invention, there is provided a method for modifying support elements of an article holder, the support elements having support surfaces for supporting an article, said method comprising: providing the lithographic apparatus described herein; contacting at least some of the support surfaces with the distal ends of the protrusions of the tool and using the tool to modify the support surfaces.

BRIEF DESCRIPTION OF THE DRAWINGS

Embodiments of the invention will now be described, by way of example only, with reference to the accompanying schematic drawings, in which:

FIG. 1 depicts a lithographic apparatus;

FIG. 3 depicts a cross-section of the tool of FIGS. 2A, 2B and 2C being used to modify a substrate holder;

FIGS. 4A, 4B and 4C show variations of the tool of the present invention;

Figure 2A:
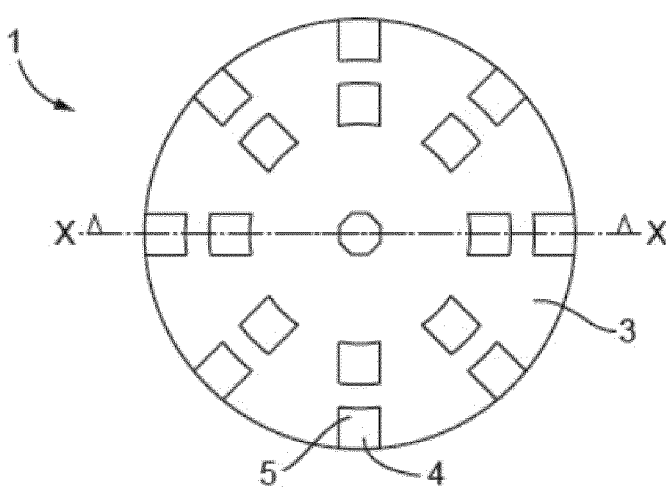
FIGS. 2A, 2B and 2C depict schematic drawings of a tool of the present invention.

The drawings provide an indication of certain features included in some embodiments of the invention. However, the drawings are not to scale. Examples of the size and range of sizes of certain features are described in the description below.

Exemplary Embodiments

Figure 1:
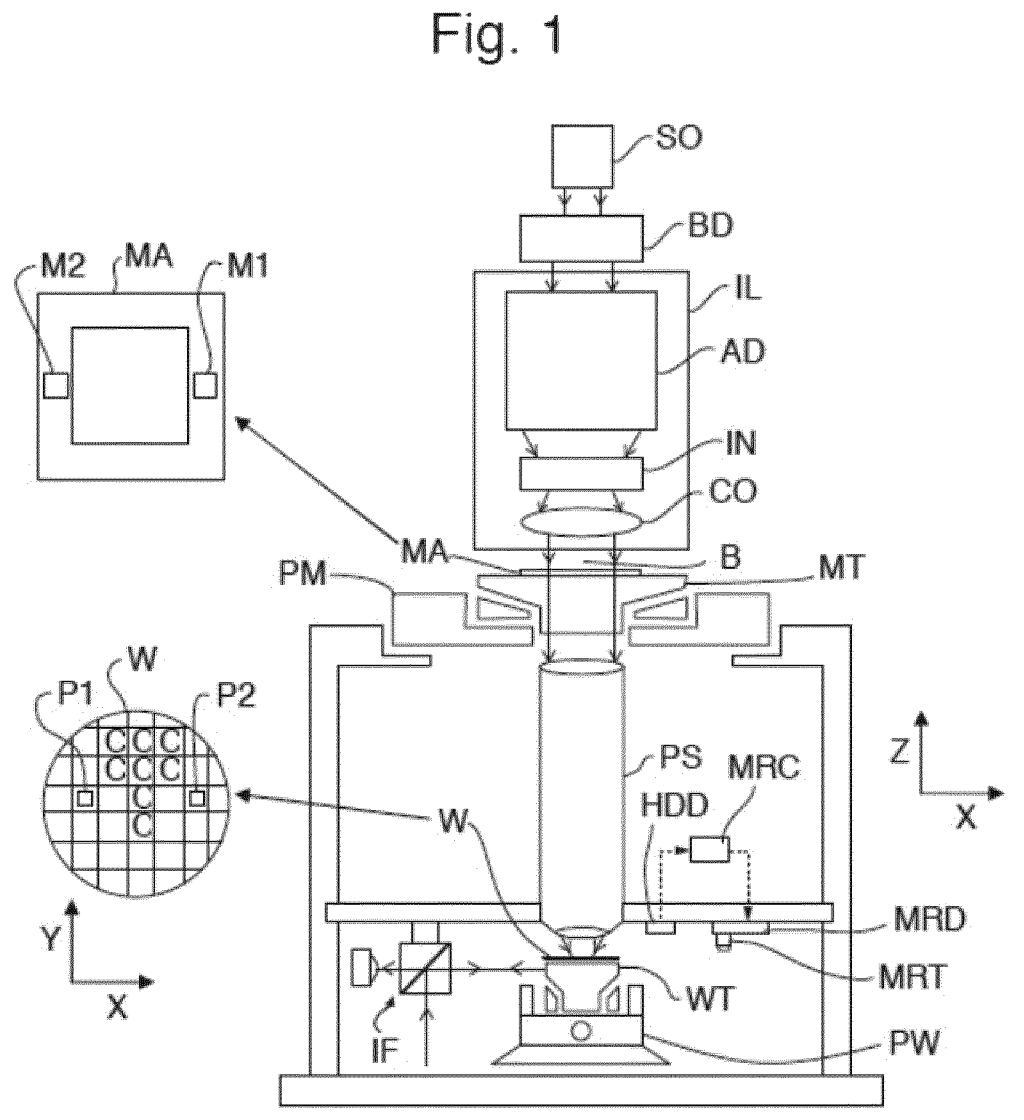

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The lithographic apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The substrate support may comprise a substrate table WT (otherwise referred to as a chuck) on which a substrate holder is supported. The substrate holder may be configured to support the substrate W. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device MA in a manner that depends on the orientation of the patterning device MA, the design of the lithographic apparatus, and other conditions, such as for example whether or not the patterning device MA is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device MA is at a desired position, for example with respect to the projection system PS. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam B may not exactly correspond to the desired pattern in the target portion of the substrate W, for example if the pattern includes phase-shifting features or so called assist features. Generally, the pattern imparted to the radiation beam B will correspond to a particular functional layer in a device being created in the target portion, such as an integrated circuit.

The patterning device MA may be transmissive or reflective. Examples of patterning devices MA include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device (e.g. mask) MA and the projection system PS. Immersion techniques can be used to increase the numerical aperture of projection systems. The term "immersion" as used herein does not mean that a structure, such as a substrate, must be submerged in liquid, but rather only means that a liquid is located between the projection system PS and the substrate W during exposure.

Referring to FIG. 1, the illuminator IL receives a radiation beam B from a radiation source SO. The source and the lithographic apparatus may be separate entities, for example when the source is an excimer laser. In such cases, the source is not considered to form part of the lithographic apparatus and the radiation beam B is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the mask support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam B is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam B is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As shown in FIG. 1, the lithographic apparatus may include an in situ material removing device MRD configured to remove material from one or more support elements of the substrate holder of the lithographic apparatus. This material removal device MRD is configured to remove material from one or more support elements of the substrate holder in order to obtain a more even support for a substrate W supported on the substrate holder. The material removal device MRD may be located at a substantially stationary location and includes a material removal tool MRT which is to be brought into contact with the one or more support elements to remove material of the one or more support elements.

The lithographic apparatus may further include a detector HDD configured to detect height deviations of the support elements that affect a surface flatness of an substrate W supported on the substrate holder. The detector HDD may for instance be a level sensor configured to measure the upper surface of a substrate W supported on the substrate holder. Such a level sensor is for instance disclosed in U.S. Pat. No. 5,191,200, which is herein incorporated by reference in its entirety. The detector HDD may be used to measure the top surface of multiple substrates to determine which errors in the surface are caused by the substrate itself, and which are caused by the substrate support, i.e. the support elements.

The detector HDD may be connected to a controller MRC coupled between the detector HDD and the material removal device MRD. The controller may be configured to control the material removal device MRD to adjust the height of the support elements corresponding to the detected height deviations of the protrusions 4 that affect the surface flatness of the substrate. The controller MRC may be a separate controller specially adapted for creating a flat surface, when required, by removing material of the support elements of the substrate holder, or it may be integrated in a controller configured to perform multiple control tasks in the lithographic apparatus.

Further details on the general operation of the material removing device MRD is disclosed in US 2005/0061995 A1, which is herein incorporated by reference in its entirety.

Generally, the removal of material from one or more support elements may be carried out by a relative movement between the material removal tool MRT and the one or more support elements. This relative movement may be performed by translating the one ore more support elements with respect to the material removal tool MRT and/or translating the material removal tool MRT with respect to the one or more support elements. The material removal tool MRT may be rotated to enhance the removal of material of the support elements.

An embodiment of the present invention provides a tool which can be used to modify the substrate holder to improve the flatness of the support elements of the substrate holder. The tool may correspond to the material removal tool MRT as described above. The tool may otherwise be referred to as a height adjustment tool.

Figure 2B:
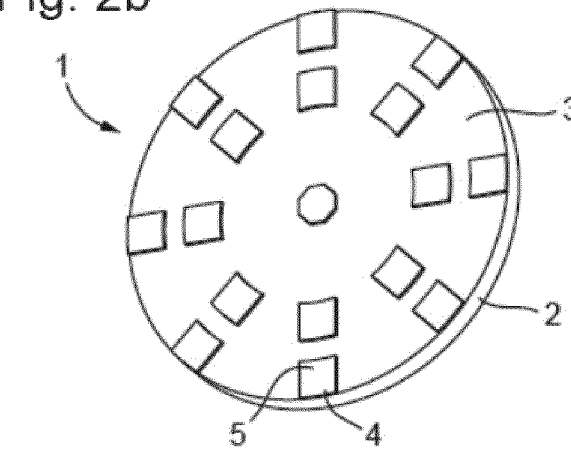
Figure 2C:
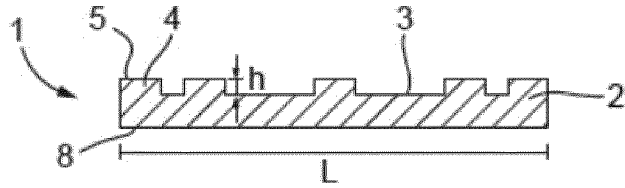

The present invention provides a tool for modifying a substrate holder. The tool can be used, more specifically, for modifying substrate supports elements of a substrate holder. The support elements may otherwise be referred to as burls. An example of the tool 1 is shown in FIGS. 2A to 2C. FIG. 2A shows a surface of the tool 1 which is for contacting the substrate holder, FIG. 2B shows a perspective view of the tool 1 and FIG. 2C shows a cross-section through X-X of FIG. 2A. The surface of the tool 1 shown in FIG. 2A may be referred to as the base of the tool 1. This is because in use, the tool 1 is generally provided with the surface shown in FIG. 2A facing downwards, towards a substrate W.

FIG. 3 shows an example of a substrate holder 20 having support elements 21 wherein the tool 1 can be used for modifying the support elements 21 of the substrate holder 20. In other words, the tool 1 may be used to remove material from the support elements 21. This may alter the overall height of at least one support element 21 and/or alter the roughness of at least one support element 21. As shown in FIG. 3, the support elements 21 have support surfaces 22. The support surfaces 22 are used to contact an underside of a substrate W. Ideally, the support surfaces 22 combined provide a flat plane on which the substrate W can be supported as described above. This enables the substrate W to be relatively flat when being irradiated, to reduce errors.

The tool 1 may optionally be part of a material removing device MRD as shown in FIG. 3. The material removing device MRD may comprise a tool support 10 as shown in FIG. 3. The tool support 10 may be configured to secure the tool 1. The tool support 10 may provide a connection between the tool 1 and the rest of a lithography apparatus.

FIG. 3 shows a part of a substrate holder 20 of a lithographic apparatus. The substrate holder 20 may be part of a substrate support configured to support a substrate W during projection of an image on the substrate W. The substrate holder 20 may be provided on a substrate table WT. The substrate holder 20 may for instance be held on the substrate table WT using a vacuum system (not shown).

The substrate holder 20 is configured such that a surface of the substrate W supported on the substrate holder 20 lies in a predetermined plane in relation to a propagation direction of the projection beam B. The surface is preferably oriented transverse to the propagation direction of the projection beam B. The substrate holder 20 has a support surface 23 and multiple support elements 21 extending from the support surface 23 to support the substrate W on the support elements 21. The configuration of the multiple support elements 21 is designed to obtain an optimal support for a substrate W supported thereon. Part of the substrate holder 20 is shown in cross-section in FIG. 3, whereby some support elements 21 lie in the plane of the cross section and some support elements 21 lie behind this plane.

As described, the substrate holder 20 may not provide a flat supporting surface for the substrate W for a number of reasons. The substrate holder 20 may degrade over time as the support elements 21 are worn down due to interaction with various substrates. Wear of the support elements 21 leads to variation in the height of the support elements across the substrate holder 20.

Friction between the substrate W and the substrate holder 20 contributes to shape of the substrate W when positioned on the substrate holder 20. This friction changes over time due to contamination and smoothing of the support elements 21 due to wear. This can lead to variation in the roughness and height of the support elements 21 over the lifetime of the substrate holder 20. Current correction methods (Alignment, APC, Baseliner) are not fully capable to limit the impact on overlay error which can result in a reduced yield of patterned substrates. The friction may change as the support elements 21 are worn down which can increase the contact area between the substrate W and the substrate holder 20.

A larger contact area generates more van der Waals forces which causes "sticking" of the substrate on the substrate holder 20. Providing a preferred roughness on the support surfaces of the support elements 21 can reduce the overall contact area and help reduce or avoid such sticking.

Generally, the support surfaces 21 which are used to contact the underside of the substrate W have a desired level of roughness. If the roughness of the support surfaces are too low then this leads to the substrate holder having increased friction which can lead to sticking and overlay errors. Therefore, it is beneficial to reduce the friction by increasing the roughness of the support surface of the support elements. Thus, it is preferable to maintain the roughness at a desired level.

The roughness of the support surfaces is generally in the nm scale. In other words, the support surfaces 22 of the support elements 21 generally have structures which are of the order of a few or tens of nanometres. For example, a substrate table WT may have contact roughness of at least 12 nm. Atomic force microscopy (AFM) can be used to characterize the contact roughness. Additionally or alternatively, a white light interferometer can be used to measure roughness. White light measurements may roughly match atomic force microscopy (AFM) measurements. If the contact roughness is below approximately 12 nm, van der Waals bonding may generally increase contact pressure and effectively increase friction.

The substrate W, when positioned on the substrate holder 20, will rest on top of the peak structures of each of the support surfaces 22. Thus, the flatness of the overall substrate holder 20 can be improved by reducing the peaks of roughness on support surfaces 22 which have peaks higher than other support surfaces 22.

The roughness of the support surfaces 22 can be determined by looking at contact pads to see where the contact pad contacts the support element. The amount of surface area of the contact pad which contacts the support surface 21 for one support elements 20 indicates the roughness of that support element 20.

The substrate holder 20 can be modified to remove material using the tool 1. This could otherwise be referred to as polishing. The material and roughness of the tool 1 may be chosen so that the resulting roughness and sticking of the substrate W on the substrate holder 20 are kept on an optimum level. The tool 1 may be used regularly, perhaps daily, which can reduce or avoid system drift. Ideally, the roughness of the tool 1 will enable flatness, a desired roughness of the support surfaces and improved van der Waals forces. The tool 1 may otherwise be referred to as a puck and/or a spotless like stone.

The tool 1 may be in contact with the support elements 21 and may be moved relative to the support elements 21 to modify the support surfaces 22. Thus, the tool 1 may be used to scratch the support surfaces 22 to alter the roughness of the support surfaces which affects the friction between the support surfaces 22 and the substrate W. Additionally or alternatively, the tool 1 can be used to wear down at least one of the support surfaces 22 in order to wear down the at least one support surface 22 to flatten the overall support plane provided by the support surfaces 22. The tool 1 may be used to make the substrate table WT more flat whilst also achieving a desired level of roughness. It may be beneficial to use a tool 1 which improves flatness without affecting the roughness (which may be at a preferred level). Alternatively, it may be beneficial to use a tool 1 which improves roughness without affecting the flatness (which may be at a preferred level). Modifying the support surfaces 22 may generally refer to altering the flatness and/or roughness of the support surfaces 22.

Multiple tools may be used. For example, a first tool may be used to generally improve the flatness of the substrate table WT, without affecting the roughness too much, and a second tool may be used to generate the preferred roughness, without affecting the overall flatness too much (or vice versa). For example, the first tool and the second tool may have different configurations (i.e. protrusions arranged in different formations) which are more suited to affecting the flatness and/or roughness of the substrate table WT. Using two tools may be beneficial because it provides greater design freedom to optimize both tools The design of the protrusions 4 on the tool 1 may alter how the tool 1 affects the roughness and the flatness of the substrate table WT. Thus, for example, the spacing (i.e. frequency) of protrusions 4 on the tool 1 may alter the effect of the tool 1 on the substrate table WT. The effect of the tool 1 on the roughness and/or flatness of the substrate table WT may additionally depend on other parameters, e.g. the cross-sectional area of the protrusions 4, the roughness of the tool 1 and/or the weight of the tool 1.

A tool 1 with low spatial frequencies may have well spaced protrusions which have a distance between the protrusions 4 of greater than approximately 32 mm. A low spatial frequency tool may have minimal to no impact on local flatness or roughness, but may be used to alter global substrate table WT flatness.

A tool with mid spatial frequencies may have a distance between protrusions 4 of less than approximately 32 mm and greater than the distance between support elements 21, e.g. greater than approximately 1.5-2.5 mm. A mid spatial frequency tool may improve flatness of the substrate table WT but may have minimal to no impact on the roughness of the substrate table WT. This type of tool may not produce beneficial effects on the flatness of the substrate table WT around the edge of the substrate table WT.

A high spatial frequency tool may have a distance between protrusions 4 of less than the distance between support elements 21, for example, less than approximately 1.5-2.5 mm. Preferably, the distance between protrusions 4 on the high spatial frequency tool is less than the diameter of the support elements 21, e.g. preferably less than or equal to approximately 210-350 μm. A high spatial frequency tool may be beneficial in improving roughness of the substrate table WT. A high spatial frequency tool may not have a beneficial effect on the flatness of the substrate table.

Alternatively, both functions may be provided by the same tool. For example, a tool with mid to high spatial frequencies may be used to modify the support elements 21 to improve the roughness and the flatness of the substrate table WT. The distance between the protrusions may be selected depending on the desired impact on the roughness and the flatness. Using only one tool may improve efficiency.

As the tool 1 is moved over the support elements 21 (to modify the substrate holder 20), the tool 1 will generally hit the peaks of the support surfaces 22 which are sticking up the highest and reduce the size of the peaks. This reduces the higher overall peaks and improves overall flatness of the combined support surfaces 22.

As shown in FIGS. 2A, 2B and 2C, the tool 1 comprises a main body 2 having a main body surface 3. The tool 1 comprises multiple protrusions 4 from the main body surface 3. In other words, the multiple protrusions 4 extend from the main body 2. The multiple protrusions 4 have distal ends 5 configured to contact the support surfaces 22 to modify the substrate support elements 21. The protrusions 4 may otherwise be referred to as islands, or pads. The distal ends 5 are the end surfaces of the multiple protrusions which are furthest away from the main body surface 3.

During wear and modification of the substrate support elements 21, debris can be generated. Debris generally refers to any contaminating material, but particularly, any material removed from the substrate support elements 21 and also from the tool 1 itself. The debris may affect the roughness and overall flatness of the substrate holder 20.

An advantage of having multiple protrusions 4 is that the there are gaps between the protrusions 4 which allow debris to be collected and possibly pushed to the gaps between the substrate support elements 21. Additionally, the multiple protrusions 4 create storage room for debris inside the tool 1 itself, allowing debris to accumulate in the gaps between the multiple protrusions 4. For both these reasons, debris is less likely to remain on the top of the support surfaces 22 of the substrate support elements 21. This reduces or prevents contamination on the support surfaces 22. Additionally, having multiple protrusions 4 means an increased number of edges contact the substrate table WT surface which may be more effective in creating substrate table WT roughness.

Additionally, providing multiple protrusions 4 means that the surface area of the tool 1 in contact with the substrate holder 20 can be controlled to average out smaller spatial frequencies in the overall flatness of the substrate holder 20.

Additionally, providing the multiple protrusions 4 means that smaller areas of the tool 1 are in contact with the substrate holder 20 when in use. This allows for scratching to occur to provide a desired level of roughness to the support surfaces which improves "sticking" issues.

As will be seen in the figures, the tool 1 may generally be in the shape of a disc or puck. In other words, the main body 2 may be plate-shaped. Thus, the main body 2 may be formed as a circular object with a relatively thin thickness. For example, the tool 1 may be of the order of several millimetres thick or tens of millimetres thick. For the purposes of example only, the tool 1 may have a thickness of approximately 1-10 mm thick, or preferably approximately 2-6 mm thick.

The tool 1 should be of a general size that it can be used to modify the support surfaces 22 of the support elements 21. Thus, the tool 1 is generally of the order of tens of millimetres in diameter. Ideally, the tool 1 should be large enough that does not fall in any gaps between substrate support elements 21.

The diameter of the tool 1 is indicated by the distance L in FIG. 2C. The diameter L of the main body 2 may be less than or equal to approximately 50 mm. The diameter L of the main body 2 may be less than or equal to approximately 35 mm or more preferably, approximately 32 mm. It is generally advantageous to have a tool 1 which is less than or equal to approximately 50 mm or preferably less than or equal to approximately 35 mm because this allows more careful control the modifications to be made to the support surfaces 22. The tool 1 will generally start to filter anything smaller than its own size. Thus, it is generally advantageous for the diameter of the tool 1 to be bigger than the exposure slit size of a lithographic apparatus, which is normally approximately 28 mm. It is generally advantageous to have the tool 1 as large as possible because the tool 1 can be used to modify a larger number of substrate support elements 21 at any one time and thus, improves efficient use of the tool 1. Thus, the main body 2 of the tool 1 may be larger than 50 mm in diameter.

The tool 1 may not comprise a through-hole. In other words, the tool 1 may not comprise a hole which passes through the main body 2, i.e. the tool 1 may not comprise a hole or cavity passing from the main body surface 3 to an opposite surface of the main body 2. It may be advantageous to avoid having a through-hole in the tool 1 to make the manufacturing process for the tool 1 simpler and easier.

The tool 1 may not have an overall toroidal shape. The tool 1 may not comprise only one recess, for example, substantially in the centre of the tool 1. The tool 1 may not be shaped to provide an annular surface for contacting the substrate holder 20. It may be advantageous to avoid having these shapes (e.g. toroidal or with a single recess) to make the manufacturing process for the tool 1 simpler and easier.

Providing a tool 1 without a through-hole and/or recess may be advantageous in that the effect of the tool 1 may be greater because the tool 1 can be used to modify a larger number of substrate support elements 21 at one time. This may be due to increased area of the tool 1 in contact with the substrate support elements 21 at any one time.

Preferably, the main body surface 3 is substantially flat. This means that the main body surface 3 ideally only has a small variations along the surface. Thus, preferably the main body surface 3 is provided substantially in a single plane. The surface may have a certain amount of roughness. Generally the part of the tool 1 which comes into contact with the substrate support elements 21 is the distal ends 5 of the tool 1. Thus, the specific roughness of the main body surface 3 may not be controlled to the same extent as the distal end 5 of the multiple protrusions 4.

The multiple protrusions 4 and the main body 2 may be provided as integral to each other. Thus, for example, the main body 2 and the multiple protrusions 4 may be formed from a single piece of material. Alternatively, the multiple protrusions 4 may be provided on the main body 2 by attaching the protrusions 4 to the main body surface 3, for example, by use of an adhesive.

The tool 1 may be made of various materials. Preferably, the hardness of the tool 1, and particularly the material forming distal ends 5, has a hardness which is the same or higher than the hardness of the support surfaces 22 of substrate holder 20. Advantageously, if the hardness of the tool 1, and particularly the distal ends 5, is harder than the support surfaces 22, then interaction between the tool 1 and the support surfaces 22 will wear down substrate holder 20 rather than the tool 1. Advantageously, if the hardness of the tool 1, and particularly the distal ends 5, is similar to the hardness of the support surfaces 22, then this can lead to high roughness of the support surfaces 22 due to interaction between the tool 1 and the support surface 22.

Preferably, the tool 1 is made of a relatively hard and tough material. The tool 1 may comprise carbon reinforced silicon carbide (CSiC), silicon infiltrated silicon carbide (SiSiC), silicon carbide (SiC), aluminium oxide ($Al_2O_3$), and/or diamond like carbon (DLC). The tool 1 may be formed from a single piece of material. Thus, the entire tool 1 may be formed of one of these materials. Alternatively, the tool 1 may be formed of a combination of materials including at least one of these materials. In particular, as the distal ends 5 of the tool 1 are the parts of the tool 1 which are arranged to contact the substrate support elements 21, specifically the material chosen for the multiple protrusions 4 may be at least one of carbon reinforced silicon carbide, silicone carbide, aluminium oxide and/or diamond like carbon. Additionally or alternatively, the tool 1 may have a layer or coating on the distal ends 5 formed of at least one of these materials.

Preferably, the multiple protrusions 4 have a height, h, of between approximately 50 nanometres to 1 mm. More preferably, the multiple protrusions 4 have a height of approximately 1 μm. The height, h, of a protrusion 4 is considered to be the distance from the main body surface 3 to the distal end 5 of one of the multiple protrusions 4, as shown in FIG. 2C. The height, h, may vary and it would be understood that the height, h, of the multiple protrusions 4 may be slowly worn down slightly over time. However, it is preferable for the protrusions 4 to be of a certain distance from the main body surface 3 to ensure that the distal ends 5 of the protrusions 4, rather than the main body surface 3, contact the support surfaces 22.

The number of protrusions 4 on a single tool 1 may vary. Preferably, the number of protrusions 4 is greater than or equal to 20. Preferably, the number of protrusions 4 is fewer than or equal to 50. The number may be varied and may be fewer than 20 or greater than 50. Ideally, the number of protrusions 4 is approximately 20-30. Providing at least three protrusions 4 may reduce or prevent tilt of the tool 1 on the surface of the substrate table WT.

Preferably, at least one of the multiple protrusions 4 has a cross-sectional area of greater than or equal to approximately 9 mm², or more preferably greater than or equal to approximately 20 mm². Preferably the cross-sectional area of the multiple protrusions 4 is the same as the area of the distal ends 5 of the multiple protrusions 4. Thus, the cross-sectional area describes the area of the multiple protrusions 4 which may come into contact with the support surfaces 22. It is preferable that the area of the multiple protrusions 4 is greater than the pitch size of the substrate support elements 21. As an example only, a tool 1 which is approximately 32 mm may cover approximately 130 substrate support elements 21 if the pitch size between support elements is approximately 2.5 mm, or approximately 360 substrate support elements 21 if the pitch size is approximately 1.5 mm. The preferable total number of protrusions may be the same as approximately half the number of substrate support elements 21 being covered. Thus, in these examples, either 65 or 180. The preferable number of protrusions 4 may be as high as180, although there could be more protrusions 4.

The total area of the multiple protrusions 4 can be optimized to guarantee a certain pressure is applied by each of the multiple protrusions 4 to the substrate holder 20. Preferably, 10% or more of the surface area of the tool 1 is formed with a protrusion. If the protrusions 4 form greater than 10% of the surface area of the tool 1 then the interaction with the substrate table WT can be increased and the effectiveness of the tool 1 may thus be increased. The width of the multiple protrusions 4 maybe selected to be greater than the distance between adjacent substrate support elements 21 in order to maintain contact between the distal ends 5 of the tool 1 and the support surfaces 22.

The multiple protrusions 4 which are shown in the various figures are generally shown as squares. Thus, the distal ends 5 are generally shown to be square. However, this is not necessary. The multiple protrusions 4 could be provided in any shape. For example, the multiple protrusions 4 may have a circular cross-sectional area or a triangular cross-sectional area. Other more complicated shapes could be used. The shape of the multiple protrusions 4 may be selected to improve debris removal and thus, reduce contamination. However, having a simple shape, such as a square, triangle or circle would likely be easier to manufacture. The multiple protrusions 4 may be uniform, in that they are all of a similar height and/or shape. Alternatively, at least one of the multiple protrusions 4 may differ in height and/or shape from the other multiple protrusions 4.

Preferably, a pitch between adjacent multiple protrusions 4 is greater than or equal to approximately 5 mm, or preferably greater than or equal to approximately 7 mm, or preferably greater than or equal to approximately 12 mm. As will be understood, the pitch between the adjacent protrusions 4 may vary depending on the type of pattern which is provided. For example, the patterns in FIGS. 4A to 4C each have an equal pitch provided between adjacent protrusions 4. However, this may not be the case, as shown in FIGS. 2A to 2C. The pitch may be the distance from the centre of one protrusion to the centre of an adjacent protrusion 4. Furthermore, the pitch may be determined by the distance between the centre of one protrusion 4 and the closest centre of another closest protrusion 4. Thus, the pitch may be referred to as the minimum distance between protrusions 4.

The size, shape and/or pitch of the protrusions 4 may be selected to optimise the impact of the tool 1 on the substrate holder 20. Ideally, at least approximately 10-15 support surfaces are in contact with the tool 1 at any one time (during use) to guarantee uniform contact between the tool 1 and the substrate holder 20.

The multiple protrusions 4 on the main body surface 3 may be provided in a variety of different patterns. Examples of these patterns are shown in FIGS. 2A to 2C and 4A to 4C, as will be described below. The multiple protrusions 4 may be provided in a uniform pattern as shown in these figures. Although various different patterns are shown, it is not necessary for the protrusions 4 to be provided in a pattern and the multiple protrusions 4 could be provided without a distinct recognisable pattern.

Figure 4C:
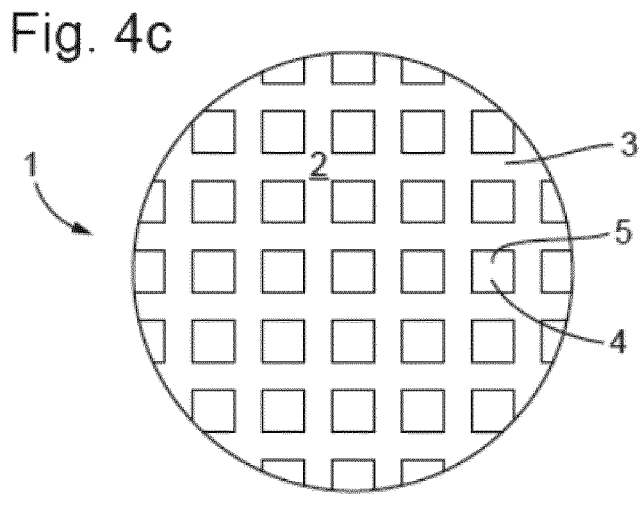
Figure 7A:
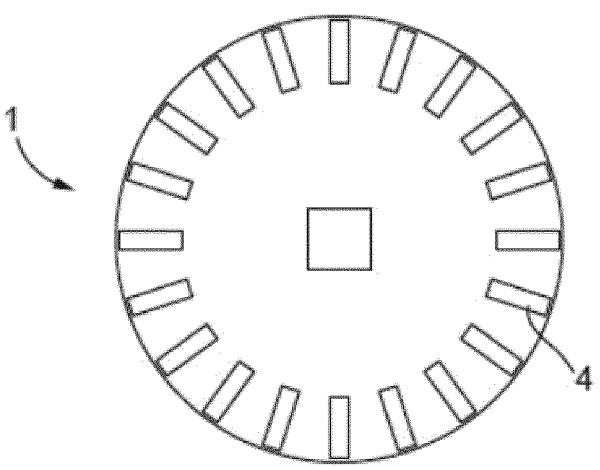
FIG. 7 shows further variations of the tool of the present invention.
Figure 7B:
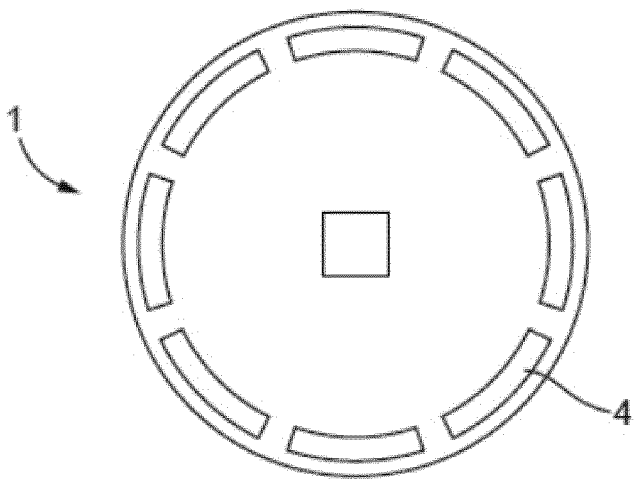

The pattern shown in FIGS. 2A to 2C has a protrusion at the centre of the main body surface 3 with additional protrusions 4 being provided along radially outward lines. An alternative pattern is depicted in FIGS. 4A to C in which rows and columns of protrusions 4 are provided with uniform distances between each row and column. A further alternative pattern is depicted in FIGS. 7A and 7B where the protrusions 4 have an elongated shape in the radial, respectively the circular direction. It will be understood that other different types of pattern may be used.

Figure 5:
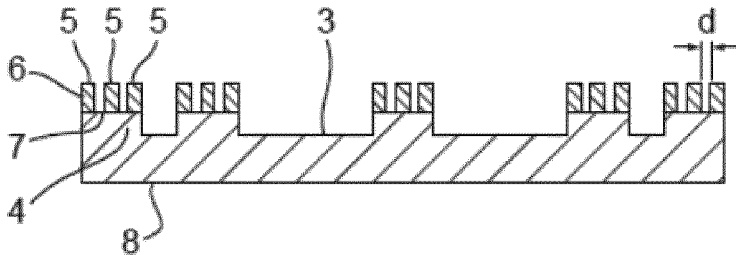
FIG. 5 shows a further variation of the tool of FIGS. 2A, 2B and 2C.

Optionally, at least one of the multiple protrusions 4 may comprise multiple projections 6, as shown in FIG. 5. The projections 6 are additional extensions on any one of the protrusions 4. Thus, any one of the multiple protrusions 4 comprising a projection 6 has a distal end 5 at the furthest point from the main body surface 3, i.e. at the end of the projection 6. This means that the distal ends 5 of the protrusions 4 are formed on the ends of the projections 6. As will be seen, this may generally mean that the protrusions 4 have smaller projections 6 extending from an intermediate surface 7. The intermediate surface 7 may correspond to the distal end of the protrusions 4 when no projections 6 are provided. As shown in FIG. 5, the projections 6 may be provided on each of the protrusions 4.

A distance, d, between adjacent projections 6 may generally be between approximately 50 nanometres to 1 mm. The multiple projections 6 may extend between approximately 50 nanometres to 1 mm. In other words, the projections 6 may have a height of approximately 50 nanometres to 1 mm from the start of a projection to the end of a projection 6.

The projections 6 may form thin lines. The thin lines may be linear or wavy or curved.

The multiple projections 6 and the protrusions 4 may be provided as integral to each other. Thus, for example, the projections 6 and the protrusions 4 may be formed from a single piece of material. Alternatively, the projections 6 may be provided on the protrusions 4 by attaching the protrusions 4 to a surface of the protrusions 4, for example, by adhesive.

Providing projections 6 as described may be particularly useful for trapping debris between the projections 6 to reduce contamination of the substrate holder 20. Additionally, the projections 6 allow the contact area of the tool 1 to be optimised and thus, the pressure under the tool 1 can be increased which can be beneficial in controlling the roughness of the support surfaces 22.

Figure 6:
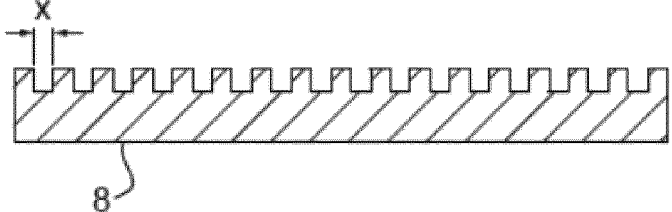
FIG. 6 shows a further variation of the tool of FIGS. 2A, 2B and 2C.

Alternatively, the multiple protrusions 4 may be provided in a similar way to the projections 6. In other words, the multiple protrusions 4 may be provided in much smaller shapes than as described above in relation to FIGS. 2, 3 and 4. For example, a distance, x, between adjacent ones of the multiple protrusions 4 may be between approximately 50 nanometres to 1 mm. Thus, in this way the protrusions 4 may generally be used to form grooves in a surface of the tool 1. An example of this is shown in FIG. 6.

The protrusions 4 may form thin lines. The thin lines may be linear or wavy or curved.

A height of the protrusions 4 in this case may be between approximately 50 nanometres to 1 mm. In other words, the distance between the distal end 5 of the protrusions 4 and the main body surface 3 is between approximately 50 nanometres to 1 mm. This may be advantageous in trapping small bits of debris in the grooves formed between the multiple protrusions 4.

Providing multiple protrusions 4 having these dimensions may be particularly useful for trapping debris between the multiple protrusions 4 to reduce contamination of the substrate holder 20. Additionally, the multiple protrusions 4 having these dimensions allow the contact area of the tool 1 to be optimised and thus, the pressure under the tool 1 can be increased which can be beneficial in controlling the roughness of the support surfaces 22.

The back surface 8 of the tool 1 may be provided in various shapes such that the tool 1 is more easily and/or securely kept in place. The tool 1 may be connected or connectable to a tool support 10. The back surface 8 of the tool 1 may comprise at least one indent to fit with the tool support 10. The back surface 8 of the tool 1 is the surface which is not used to modify they substrate holder 20. The back surface 8 of the tool 1 may be smaller in diameter than the main body surface 3, for example, to improve the connection between the tool 1 and the tool support 10.

During use, it may be preferable for the tool 1 to be kept substantially flat with respect to the substrate holder 20. In other words, it may be preferable to keep the main body surface 3 of the tool 1 substantially parallel to the surface of the substrate holder 20. However, this is not necessary and variation in the orientation of the tool 1 may allow for uneven support surfaces 22 to be more efficiently worn down or flattened. The tool 1 may be connected to the tool support 10 in a manner than allows variation of the orientation, e.g. by using a ball and socket type connection.

The tool 1 may be part of a larger system comprising multiple tool 1s. The multiple tool 1s may have the same or similar multiple protrusions 4 and/or projections 6. At least one of the tool 1s may be different from the other tool 1s.

The tool 1 may be used to pass over a whole substrate holder 20. In other words, the tool 1 may be used to contact each support element 21 at least once.

A method may be provided using the tool 1 described above. More specifically, the method may be for modifying substrate support elements 21 of a substrate holder 20. The substrate support elements 21 having support surfaces 22 for supporting a substrate W. The method may comprise providing a tool 1 as described above. The method may further comprise contacting at least some of the support surfaces 22 of the substrate holder 20 with the distal ends 5 of the protrusions 4 of the tool 1 and using the tool 1 to modify the support surfaces 22.

The substrate holder 20 may be moved along the tool 1 in order to remove material from the tops of the substrate support elements 21 which the tool 1 contacts. Alternatively, the tool 1 may be moved relative to the substrate holder 20, e.g. whilst the substrate holder 20 is kept stationary. For example, a material removal device MRD may be configured to move the tool 1 over the substrate support elements 21, while the substrate holder 20 is not moved. Alternatively, the substrate holder 20 and the tool 1 may be simultaneously moved.

To improve removal of material, the tool 1 may be rotated (relative to the substrate holder) about an axis parallel to the z-direction shown in FIG. 3. However, this may not be required to obtain the desired modification of the substrate holder 20.

The pressure in the z-direction between the tool 1 and the substrate support elements 21, used to obtain an abrasive effect, may be exerted by the substrate holder 20 or tool 1 (or more specifically the material removal device MRD) or by both. Preferably, the use of the tool 1 should be accurately controlled because if the force imparted by the tool 1 is too large, then this can have a negative impact on flatness of the substrate holder 20.

The tool 1 may be used in a variety of ways. For example, the tool 1 may be used to modify the whole substrate holder 20, i.e. to pass over the whole substrate holder 20 in one sitting. Alternatively, the tool 1 may be used to modify a localised area, i.e. a portion of the whole substrate holder 20. The frequency of using the tool 1 may vary. For example, local cleaning of a specific portion of the substrate holder 20 may be carried out several times a day, e.g. 4-5 times daily. Larger cleaning of the whole of the substrate holder 20 may be carried out less frequently, e.g. daily or weekly. The frequency and type of modification may be determined based on, for example, measurements taken indicating the flatness of the substrate W and/or the substrate holder 20. The flatness of the substrate holder 20 is considered to be the flatness of the support surfaces 22 on which the substrate W is positioned.

A lithographic apparatus may be provided comprising a tool 1 as described above. A lithographic apparatus may be configured to modify substrate support elements 21 of a substrate holder 20 using the tool 1. The lithographic apparatus may comprise a substrate holder 20 having a plurality of support elements that are configured to support a substrate.

The lithographic apparatus comprising the tool 1 may be all or part of the lithographic apparatus described above in relation to FIG. 1. The lithographic apparatus comprising the tool 1 may be at least part of a metrology device and/or an inspection device (e-beam). The lithographic apparatus comprising the tool 1 may be used in conjunction with the lithographic apparatus described in FIG. 1. The lithographic apparatus comprising the tool 1 may more generally be referred to as an apparatus configured to modify substrate support elements 21 of a substrate holder.

The lithographic apparatus comprising the tool 1 may further comprise a detector configured to detect a height deviation of one or more of the support elements that affect a surface flatness of the substrate supported on the substrate holder. The detector may correspond to the detector HDD described earlier. The tool 1 may be configured to modify a height of the one or more support elements corresponding to the detected height deviation of the support elements.

A corresponding method may be provided using the lithographic apparatus.

Hereinabove the use of a tool 1 is described for the removal of material of one or more substrate support elements 21 of a support holder to provide a more even support for a substrate support thereon. A similar tool 1 may also be used for other article support systems, such as a patterning device support. Thus, the tool 1 may be used more generally to contact support surfaces. For example, a lithographic apparatus is provided in an embodiment. In this embodiment, the lithographic apparatus is configured to modify support elements of an article holder. The lithographic apparatus comprises an article holder having a plurality of support elements, the support elements having support surfaces configured to support an article. The lithographic apparatus further comprises a material removing device having a tool 1 comprising a main body 2 having a main body surface 3, wherein the tool 1 comprises multiple protrusions 4 from the main body surface 3, the multiple protrusions 4 having distal ends configured to contact the support surfaces to modify the support elements.

The lithographic apparatus comprising the tool 1 may be all or part of the lithographic apparatus described above in relation to FIG. 1. The lithographic apparatus comprising the tool 1 may be at least part of a metrology device and/or an inspection device (e-beam). The lithographic apparatus comprising the tool 1 may be used in conjunction with the lithographic apparatus described in FIG. 1. The lithographic apparatus comprising the tool 1 may more generally be referred to as an apparatus configured to modify support elements of an article holder.

In this embodiment, the lithographic apparatus comprising the tool 1 may further comprising a detector configured to detect a height deviation of one or more of the support elements that affect a surface flatness of the article supported on the article holder. The detector may correspond to the detector HDD described earlier. The detector may be similar to the detector HDD but may be used to detect a surface flatness of an article, rather than a substrate. The tool 1 may be configured to modify a height of the one or more support elements corresponding to the detected height deviation of the support elements.

A corresponding method may be provided for modifying support elements of an article holder, the support elements having support surfaces for supporting an article. The method comprising providing the lithographic apparatus according to this embodiment, contacting at least some of the support surfaces with the distal ends of the protrusions of the tool and using the tool to modify the support surfaces.

The tool used in this embodiment for modifying an article may have any or all of the variations described above for the tool 1 used specifically to modify the substrate holder 20.

The provision of the tool 1 according to an embodiment of the invention in a lithographic apparatus offers a number of benefits over prior art lithographic apparatus. A first benefit is that the substrate table/holder (or other support surfaces) can be installed in a lithographic apparatus with a smaller flatness and thus at a lower cost, as the substrate holder can be flattened in the lithographic apparatus by using the tool 1. Further, wear of the substrate holder is no longer of great importance as the unflatness due to wear may be corrected. As a result, less stringent restrictions on the wafer table/substrate holder 20 material may be used. Moreover, by using the tool 1, the flatness of the support surfaces 22 may be improved in the course of time therewith improving the overlay performance of the lithographic apparatus.

Embodiments provided according to the following clauses:

1. A tool for modifying substrate support elements of a substrate holder, the substrate support elements having support surfaces for supporting a substrate, said tool comprising a main body having a main body surface, wherein the tool comprises multiple protrusions from the main body surface, the multiple protrusions having distal ends configured to contact the support surfaces to modify the substrate support elements.

2. The tool of clause 1, wherein a pitch between adjacent protrusions is greater than or equal to approximately 5 mm, or preferably greater than or equal to approximately 7 mm, or more preferably greater than or equal to approximately 12 mm.

3. The tool of clause 1 or clause 2, wherein at least one of the multiple protrusions has a cross-sectional area of greater than or equal to approximately 9 mm², or more preferably greater than or equal to approximately 20 mm².

4. The tool of clause 1, wherein the distal end of at least one of the multiple protrusions comprises multiple projections, wherein a distance between adjacent ones of the multiple projections is between approximately 50 nm to 1 mm.

5. The tool of clause 4, wherein the multiple projections extend between approximately 50 nm to 1 mm from the distal ends.

6. The tool of clause 1, wherein a distance between adjacent ones of the multiple protrusions is between approximately 50 nm to 1 mm.

7. The tool of clause 6, wherein a distance between the distal ends and the main body surface 3 is between approximately 50 nm to 1 mm.

8. The tool of clause 1, 2, 4 or 6, wherein the main body is plate shaped.

9. The tool of clause 8, wherein a diameter of the main body is less than or equal to approximately 50 mm, or preferably less than or equal to approximately 35 mm.

10. The tool of clause 1, 2, 4 or 6, wherein the tool does not comprise a through-hole.

11. The tool of clause 1, 2, 4 or 6, wherein the main body surface is substantially flat.

12. The tool of clause 1, 2, 4 or 6, wherein the tool comprises silicon-infiltrated silicon carbide, silicon carbide, aluminium oxide, and/or diamond like carbon.

13. A method for modifying substrate support elements of a substrate holder, the substrate support elements having support surfaces for supporting a substrate, said method comprising:

providing the tool of any one of clauses 1-12;

contacting at least some of the support surfaces with the distal ends of the protrusions of the tool and using the tool to modify the support surfaces.

14. A lithographic apparatus comprising:

a substrate holder having a plurality of support elements that are configured to support a substrate;

a material removing device configured to modify the substrate support elements of the substrate holder, the material removing device having a tool for modifying the substrate support elements of the substrate holder as in any one of clauses 1-12.

15. The lithographic apparatus of clause 14, further comprising a detector configured to detect a height deviation of one or more of the support elements that affect a surface flatness of the substrate supported on the substrate holder, wherein the tool is configured to modify a height of the one or more support elements corresponding to the detected height deviation of the support elements.

16. A method for modifying substrate support elements of a substrate holder, the substrate support elements having support surfaces for supporting a substrate, said method comprising:

providing the lithographic apparatus of any one of clauses 14-15;

contacting at least some of the support surfaces with the distal ends of the protrusions of the tool and using the tool to modify the support surfaces.

17. A lithographic apparatus comprising:

an article holder having a plurality of support elements, the support elements having support surfaces configured to support an article;

a material removing device configured to modify support elements of the article holder, the material removing device having a tool comprising a main body having a main body surface, wherein the tool comprises multiple protrusions from the main body surface, the multiple protrusions having distal ends configured to contact the support surfaces to modify the support elements.

18. The lithographic apparatus of clause 17, further comprising a detector configured to detect a height deviation of one or more of the support elements that affect a surface flatness of the article supported on the article holder, wherein the tool is configured to modify a height of the one or more support elements corresponding to the detected height deviation of the support elements.

19. A method for modifying support elements of an article holder, the support elements having support surfaces for supporting an article, said method comprising:

providing the lithographic apparatus of any one of clauses 17-18;

contacting at least some of the support surfaces with the distal ends of the protrusions of the tool and using the tool to modify the support surfaces.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool.

Where applicable, the disclosure herein may be applied to such and other substrate processing tool Is. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The descriptions above are intended to be illustrative, not limiting. Thus, it will be apparent to one skilled in the art that modifications may be made to the invention as described without departing from the scope of the claims set out below.

The invention claimed is:

1. A tool for modifying support elements of a holder, the support elements having support surfaces for supporting an article, the tool comprising:
   a circular main body having a main body surface, and
   multiple protrusions extending directly from the main body surface and provided along radial lines, wherein a radial line of some of the protrusions extends from, and is located on an opposite side of, a central portion of the circular main body as another radial line of some of the protrusions that also extends from the central portion and the protrusions are arranged not to be moved, during use, relative to the main body surface, each protrusion having a distal end and each of the distal ends of the protrusions not provided with an annular, annulus sector or circular surface,
   wherein the distal end of at least one of the protrusions comprises multiple projections, each of the projections being in the form of a line and distal ends of the projections configured to contact the support surfaces to modify the support elements.

2. The tool of claim 1, wherein a pitch between adjacent protrusions is greater than or equal to approximately 5 mm.

3. The tool of claim 1, wherein at least one of the protrusions has a cross-sectional area of greater than or equal to approximately 9 mm$^2$.

4. The tool of claim 1, wherein a distance between adjacent ones of the multiple projections is between approximately 50 nm to 1 mm.

5. The tool of claim 4, wherein the multiple projections extend between approximately 50 nm to 1 mm from the distal ends.

6. The tool of claim 1, wherein a distance between adjacent ones of the multiple protrusions is between approximately 50 nm to 1 mm.

7. The tool of claim 6, wherein a distance between the distal ends of the protrusions and the main body surface is between approximately 50 nm to 1 mm.

8. The tool of claim 1, wherein the main body is plate shaped.

9. The tool of claim 8, wherein a diameter of the main body is less than or equal to approximately 50 mm.

10. The tool of claim 1, wherein the tool does not comprise a through-hole.

11. The tool of claim 1, wherein the main body surface is substantially flat.

12. The tool of claim 1, comprising silicon-infiltrated silicon carbide, silicon carbide, aluminium oxide, and/or diamond like carbon.

13. A method for modifying support elements of a holder, the support elements having support surfaces for supporting an article, the method comprising:
   providing the tool of claim 1; and
   contacting at least some of the support surfaces with tool and using the tool to modify the support surfaces.

14. The tool according to claim 1, wherein the protrusions have a coating.

15. A lithographic apparatus comprising:
   a holder having a plurality of support elements that are configured to support a substrate or a patterning device; and
   a material removing device configured to modify the support elements, the material removing device having a tool comprising:
   a circular main body having a main body surface, and
   multiple protrusions extending directly from the main body surface and provided along radial lines, wherein a radial line of some of the protrusions extends from, and is located on an opposite side of, a central portion of the circular main body as another radial line of some of the protrusions that also extends from the central portion and the protrusions are arranged not to be moved, during use, relative to the main body surface, each protrusion having a distal end and each of the distal ends of the protrusions not provided with an annular, annulus sector or circular surface,
   wherein the distal end of at least one of the protrusions comprises multiple projections, each of the projections being in the form of a line and distal ends of the projections configured to contact the support surfaces to modify the support elements.

16. The lithographic apparatus of claim 15, further comprising a detector configured to detect a height deviation of one or more of the support elements that affect a surface flatness of the substrate or patterning device supported on the holder, wherein the tool is configured to modify a height of the one or more support elements corresponding to the detected height deviation of the support elements.

17. A method for modifying support elements of a holder, the support elements having support surfaces for supporting a substrate or a patterning device, the method comprising:
   providing the lithographic apparatus of claim 15; and
   contacting at least some of the support surfaces with the tool and using the tool to modify the support surfaces.

18. An apparatus comprising:
   an article holder having a plurality of support elements, the support elements having support surfaces configured to support an article; and
   a material removing device configured to modify support elements of the article holder, the material removing device having a tool comprising:
   a circular main body having a main body surface, and
   multiple protrusions extending directly from the main body surface and provided along radial lines, wherein a radial line of some of the protrusions extends from, and is located on an opposite side of, a central portion of the circular main body as another radial line of some of the protrusions that also extends from the central portion and the protrusions are arranged not to be moved, during use, relative to the main body surface, each protrusion having a distal end and each of the distal ends of the protrusions not provided with an annular, annulus sector or circular surface,
   wherein the distal end of at least one of the protrusions comprises multiple projections, each of the projections being in the form of a line and distal ends of the projections configured to contact the support surfaces to modify the support elements.

19. The apparatus of claim 18, further comprising a detector configured to detect a height deviation of one or more of the support elements that affect a surface flatness of the article supported on the article holder, wherein the tool is configured to modify a height of the one or more support elements corresponding to the detected height deviation of the support elements.

20. A method for modifying support elements of an article holder, the support elements having support surfaces for supporting an article, the method comprising:

providing the apparatus of claim 18, and contacting at least some of the support surfaces with the tool and using the tool to modify the support surfaces.

\* \* \* \* \*